United States Patent
Hsu

(10) Patent No.: US 10,867,988 B2
(45) Date of Patent: Dec. 15, 2020

(54) INTEGRATED ESD ENHANCEMENT CIRCUIT FOR SOI DEVICE

(71) Applicant: Taiwan Semiconductor Manufacturing Co., Ltd., Hsin-Chu (TW)

(72) Inventor: Sheng-Fu Hsu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 3 days.

(21) Appl. No.: 16/161,453

(22) Filed: Oct. 16, 2018

(65) Prior Publication Data

US 2020/0105740 A1 Apr. 2, 2020

Related U.S. Application Data

(60) Provisional application No. 62/738,055, filed on Sep. 28, 2018.

(51) Int. Cl.
*H01L 27/02* (2006.01)
*H02H 9/04* (2006.01)
*H01L 27/12* (2006.01)
*H01L 21/84* (2006.01)

(52) U.S. Cl.
CPC .......... *H01L 27/0255* (2013.01); *H01L 21/84* (2013.01); *H01L 27/1203* (2013.01); *H02H 9/046* (2013.01)

(58) Field of Classification Search
CPC . H01L 27/0255; H01L 27/1203; H01L 21/84; H02H 9/046
See application file for complete search history.

(56) References Cited

U.S. PATENT DOCUMENTS

| | | | | |
|---|---|---|---|---|
| 4,990,976 A * | 2/1991 | Hattori | ............... | H01L 27/0255 257/355 |
| 5,610,790 A * | 3/1997 | Staab | ................. | H01L 27/0255 361/111 |
| 6,271,999 B1 * | 8/2001 | Lee | ..................... | H01L 27/0259 257/567 |
| 2010/0328826 A1 * | 12/2010 | Salman | ................. | H01L 21/84 361/56 |

* cited by examiner

*Primary Examiner* — Kyoung Lee
*Assistant Examiner* — Christina A Sylvia
(74) *Attorney, Agent, or Firm* — Eschweiler & Potashnik, LLC

(57) ABSTRACT

The present disclosure relates to an integrated circuit. The integrated circuit comprises a silicon on insulator (SOI) device separated from a SOI substrate by an insulation layer. The SOI device comprises a power supply terminal, a ground terminal, a first I/O terminal and a second I/O terminal. An electrostatic discharge (ESD) protection circuit is integrated with the SOI device. The ESD protection circuit is configured to shunt current between two terminals of the SOI device during an ESD surge event. An electrostatic discharge (ESD) enhancement circuit is integrated with the SOI device. The ESD enhancement circuit is configured to clamping the SOI substrate to a lower potential of the two terminals of the SOI device.

20 Claims, 3 Drawing Sheets

INTEGRATED ESD ENHANCEMENT CIRCUIT FOR SOI DEVICE

REFERENCE TO RELATED APPLICATION

This application claims priority to U.S. Provisional Application No. 62/738,055, filed on Sep. 28, 2018, the contents of which are hereby incorporated by reference in their entirety.

BACKGROUND

Silicon on insulator (SOI) technology refers to the use of a layered silicon-insulator-silicon substrate in place of conventional silicon substrates in semiconductor manufacturing, especially microelectronics, to reduce parasitic device capacitance, thereby improving performance. SOI-based devices differ from conventional silicon-built devices in that the silicon junction is above an electrical insulator, typically silicon dioxide or sapphire. The choice of insulator depends largely on intended application, with sapphire being used for high-performance radio frequency (RF) and radiation-sensitive applications, and silicon dioxide for diminished short channel effects in microelectronics devices. Electrostatic discharge (ESD) is a sudden release of electrostatic charge which can result in high electric fields and currents within an integrated circuit and is one type of overshoot that can damage devices on integrated circuits.

DETAILED DESCRIPTION

Figure 1:
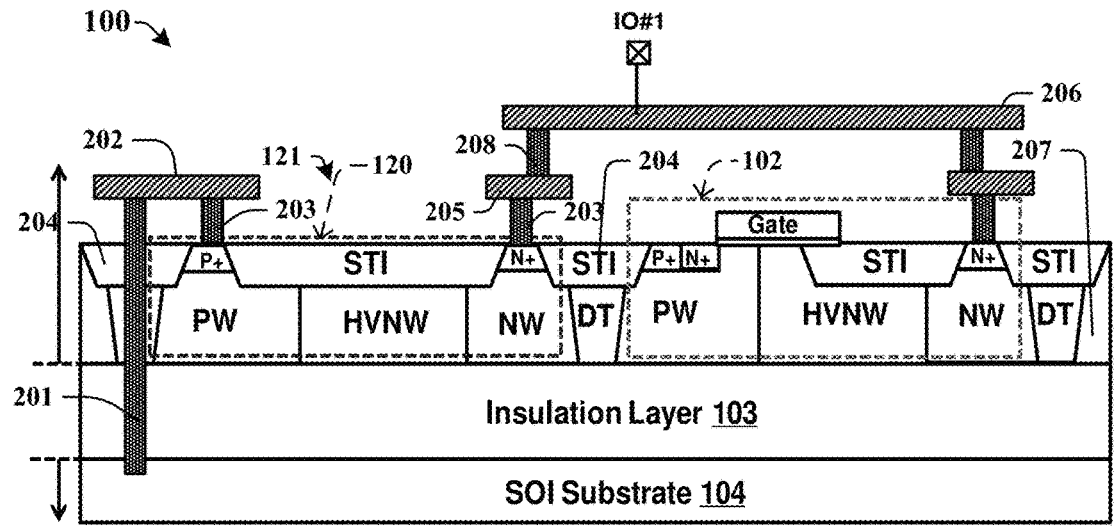
FIG. 1 illustrates a cross-sectional view of an integrated circuit including an electrostatic discharge (ESD) enhancement circuit integrated with a silicon on insulator (SOI) device in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

High voltage circuits and devices have become widely used in modern electronic circuits for power management, power distribution, RF ICs, or driver ICs. The use of SOI (Silicon-On-Insulator) technology in a high-voltage process provides advantage of SOI such as latch-up free operation, a high packing density and less leakage current. However, high voltage SOI device suffered unstable ESD robustness performance due to a floating (uncontrollable) SOI substrate bias during an ESD event or an ESD test. To improve the ESD performance in high voltage SOI process, the SOI substrate bias should be controllable at the lowest voltage during ESD events or ESD tests. In a current approach, the SOI substrate may be connected to the circuit ground, but this approach limits the flexibility of the SOI device.

The present disclosure relates to an integrated circuit including an electrostatic discharge (ESD) enhancement circuit integrated with a SOI device, and associated methods of enhancing the ESD performance of the SOI device. The electrostatic discharge (ESD) enhancement circuit is configured to control the SOI substrate bias to a low voltage during an ESD strike or an ESD test (an ESD surge event hereafter). The SOI substrate is not directly connected to a circuit ground, so the circuit design is more flexible. The ESD enhancement circuit is integrated within the semiconductor layers of the SOI device and fabricated together with the SOI device such that parasitic inductance and parasitic capacitance are reduced. In some embodiments, the ESD enhancement circuit comprises a pair of clamping diodes. The pair of clamping diodes is connected back to back: having cathodes respectively connected to two terminals of the SOI device and anodes directly connected together and directly connected to the SOI substrate. Thus, when a bias is applied between the two terminals (e.g. during an ESD surge event), the SOI substrate can be clamped to a lower potential of the two terminals. Thus, the SOI substrate bias should be controllable to the low voltage during the ESD surge event. Thereby, a stable high SOI device breakdown voltage and safe operation area (SOA) can be achieved.

FIG. 1 illustrates a cross-sectional view of an integrated circuit (IC) 100 including a SOI device 102 and an electrostatic discharge (ESD) enhancement circuit 120 integrated on a SOI substrate 104 and separated from the SOI substrate 104 by an insulation layer 103 in accordance with some embodiments. The SOI device 102 can be devices used in various applications, such as but not limited to RF components, high voltage applications such as gate drivers (IGBT/Power MOSFET), smart power/high voltage devices, pressure sensors, microfluidic components, actuators, accelerometers, gyroscopes or silicon microphones. An NMOS having its drain region connected to a first I/O terminal I/O #1 is shown in FIG. 1 as a representative of the SOI device 102, but it is understood that the SOI device 102 can be or include other structures that is disposed on the SOI substrate 104 and separated from the SOI substrate 104 by the insulation layer 103. In some embodiments, the electrostatic discharge (ESD) enhancement circuit 120 includes a first clamping diode 121. The first clamping diode 121 can be a diode, a parasitic diode, or any devices standalone or in series/parallel connections, possessing diode-like single polarity rectifier feature. A P-N junction diode structure including a p-type doping area PW, a lateral high voltage n-type doping area HVNW, and an n-type doping area NW is shown in FIG. 1 as a representative of the first clamping diode 121, but it is understood that the first clamping diode 121 can include other structures that is integrated with the SOI device 102, disposed on the SOI substrate 104, and separated from the SOI substrate 104 by the insulation layer 103. Doping regions of the first clamping diode 121 and the SOI device 102 are integrated in a semiconductor layer 207, and may be separated by a plurality of isolation structures 204. The isolation structures 204 may comprise shallow trench isolations STI disposed on an upper region of the semiconductor layer 207 and deep trench isolations DT disposed in a lower region of the semiconductor layer 207. In some region, the shallow trench isolation STI directly overlies the deep trench isolation DT. The shallow trench isolation STI and the deep trench isolation DT may collectively disposed through the semiconductor layer 207.

In some embodiments, an anode of the first clamping diode 121 is connected to the SOI substrate 104. A conductive plug 203 may be used to connect the anode (p-type doping area PW in FIG. 1) through a heavily doped region P+ to achieve optimal contact (such as ohmic contact or near ohmic contact). The conductive plug 203 is connected to a lateral metal line 202 and a conductive via 201 disposed through the insulation layer 103. The conductive via 201 may be disposed through the isolation structure 204 such as the shallow trench isolation STI and the deep trench isolation DT. An cathode of the first clamping diode 121 is connected to a terminal of the SOI device 102, for example, the first I/O terminal I/O #1. Similarly, the cathode of the first clamping diode 121 may be connected by another conductive plug 203 to one or more interconnect lines 205, 206 and interconnect vias 208 and further connected to pads of the first I/O terminal I/O #1.

Figure 2:
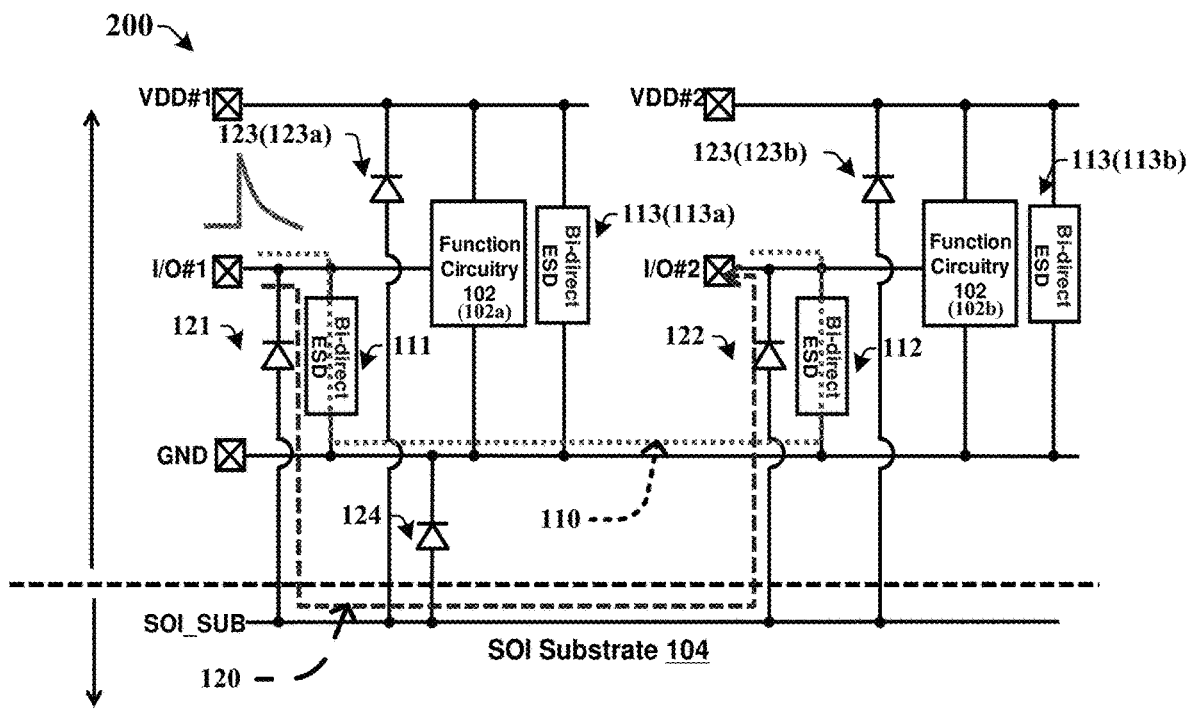
FIG. 2 illustrates a circuit diagram of an integrated circuit including an electrostatic discharge (ESD) enhancement circuit integrated with a silicon on insulator (SOI) device in accordance with some embodiments.

FIG. 2 illustrates a circuit diagram of an integrated circuit (IC) 200 including an ESD enhancement circuit 120 integrated with a silicon on insulator (SOI) device 102 in accordance with some embodiments. An illustrative cross-sectional view of the ESD enhancement circuit 120 and the silicon on insulator (SOI) device 102 can be referred to FIG. 1 and its corresponding description above. In some embodiments, the SOI device 102 comprises a power supply terminal VDD, a ground terminal GND, a first I/O terminal I/O #1, and a second I/O terminal I/O #2. In some embodiments, a first power supply terminal VDD #1 is used to provide power supply to a first section 102a of the SOI device 102, and a second power supply terminal VDD #2 is used to provide power supply to a second section 102b of the SOI device 102.

An ESD protection circuit 110 may be integrated with the SOI device 102. The ESD protection circuit 110 is configured to shunt current between two terminals of the SOI device 102 during an ESD surge event. The ESD protection circuit 110 may comprise a bi-directional ESD protection device connected between the two terminals. For example, the ESD protection circuit 110 may comprise a first bi-directional ESD protection device 111 connected between the first I/O terminal I/O #1 and the ground terminal GND. When an ESD surge strikes from the first I/O terminal I/O #1, the ESD current can be shunted through the first bi-directional ESD protection device 111. Similarly, the ESD protection circuit 110 may also comprise a second bi-directional ESD protection device 112 connected between the second I/O terminal I/O #2 and the ground terminal GND. The ESD protection circuit 110 may also comprise a third bi-directional ESD protection device 113 (113a, 113b) connected between the power supply terminal (VDD #1, VDD #2) and the ground terminal GND. As an example, the bi-directional ESD protection devices 111, 112, 113 may comprise a pair of back to back Zener or avalanche diodes.

In some embodiments, the ESD enhancement circuit 120 is integrated with the SOI device 102 and the ESD protection circuit 110 and configured to clamping the SOI substrate 104 to a lower potential of two terminals of the SOI device 102 during an ESD surge event. The ESD enhancement circuit 120 may comprise a first clamping diode 121 and a second clamping diode 122 connected back to back. The first clamping diode 121 has a first cathode connected to the first I/O terminal I/O #1 and a first anode directly connected to the SOI substrate 104. The second clamping diode 122 has a second cathode connected to the second I/O terminal I/O #2 and a second anode directly connected to the SOI substrate 104. When an ESD surge is applied between the first I/O terminal I/O #1 and the second I/O terminal I/O #2, the SOI substrate 104 is clamped to a lower potential of the two terminals or a potential close to the lower potential of the two terminals (e.g. less than 1V greater than the lower potential of the two terminals). For example, when the first I/O terminal I/O #1 is high (10V) and the second I/O terminal I/O #2 is low (0V), the SOI substrate 104 can be clamped to about 0.6V. The ESD enhancement circuit 120 may further comprise a third clamping diode 123 (123a, 123b) having a third cathode connected to the power supply terminal (VDD #1, VDD #2) and a third anode directly connected to the SOI substrate 104. The ESD enhancement circuit 120 may further comprise a fourth clamping diode 124 having a fourth cathode connected to the ground terminal and a fourth anode directly connected to the SOI substrate 104. Since the ESD enhancement circuit 120 is for purpose of clamping potential of the SOI substrate 104, device sizes of the ESD enhancement circuit 120 is smaller than the device sizes of the ESD protection circuit 110. For example, a lateral area size of the clamping diode 121, 122, or 123 of the ESD enhancement circuit 120 may be about 100 times smaller than a lateral area size of a shunt diode of the ESD protection circuit 110.

Figure 3:
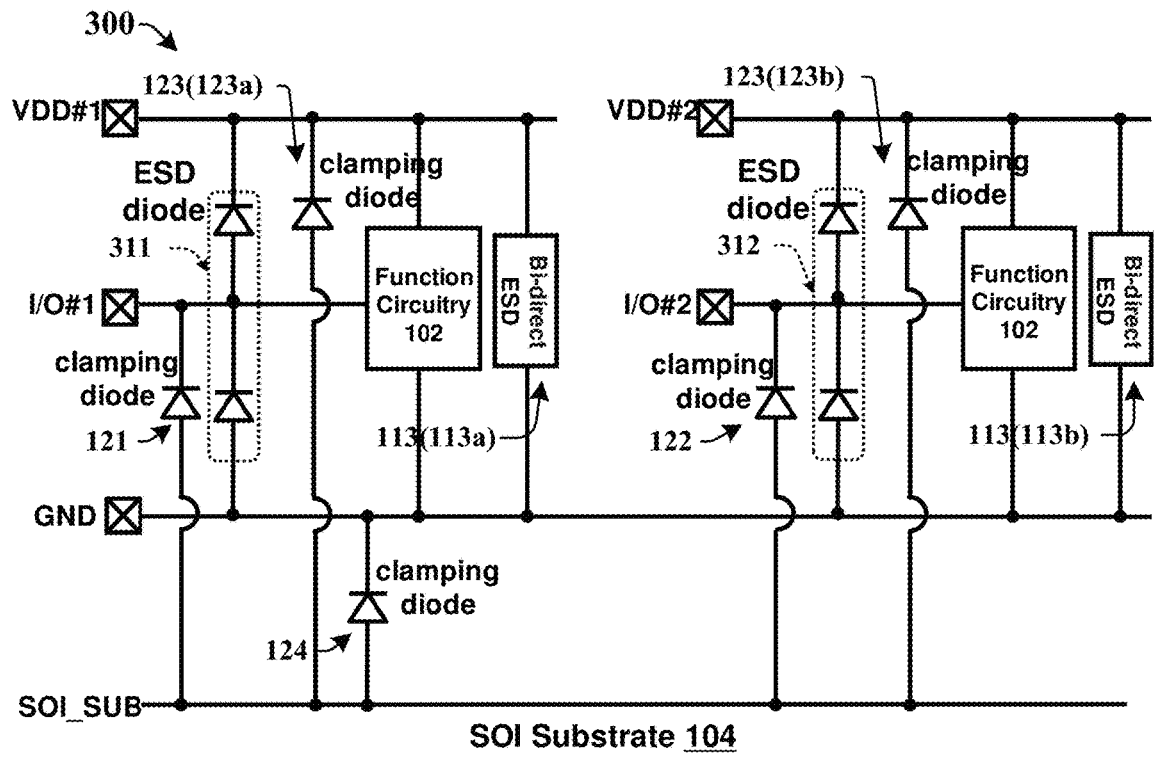
FIG. 3 illustrates a circuit diagram of an integrated circuit including an electrostatic discharge (ESD) enhancement circuit integrated with a silicon on insulator (SOI) device in accordance with some alternative embodiments.

FIG. 3 illustrates a circuit diagram of an integrated circuit (IC) 300 including an ESD enhancement circuit integrated with a silicon on insulator (SOI) device 102 in accordance with some alternative embodiments. The IC 300 may have similar features as described above associated with FIG. 1 and FIG. 2. As an alternative embodiment to the IC 200 shown in FIG. 2, the ESD protection circuit of the IC 300 may comprise a first pair of ESD current shunt diodes 311 comprising a first ESD current shunt diode connected between the first I/O terminal I/O #1 and the power supply terminal VDD #1 and a second ESD current shunt diode connected between the first I/O terminal I/O #1 and the ground terminal GND. The ESD protection circuit of the IC 300 may further comprise a second pair of ESD current shunt diodes 312 comprising a first ESD current shunt diode connected between the second I/O terminal I/O #2 and the power supply terminal VDD #2 and a second ESD current shunt diode connected between the second I/O terminal I/O #2 and the ground terminal GND. A bi-directional ESD protection device 113 is connected between the power supply terminal (VDD #1, VDD #2) and the ground terminal GND. The ESD enhancement circuit of the IC 300 may comprise the same devices as the ESD enhancement circuit 120 shown and described in FIG. 2. The ESD enhancement circuit may comprise a first clamping diode 121 and a second clamping diode 122 connected back to back having the cathodes respectively connected to the first I/O terminal I/O #1 and the second I/O terminal I/O #2 and anodes connected together and directly connected to the SOI substrate 104. The ESD enhancement circuit may further comprise a third clamping diode 123 (123a, 123b) having a third cathode connected to the power supply terminal (VDD #1, VDD #2) and a third anode directly connected to the SOI substrate 104. The ESD enhancement circuit may further comprise a fourth clamping diode 124 having a fourth cathode directly connected to the ground terminal and a fourth anode directly connected to the SOI substrate 104. Since the ESD enhancement circuit is for purpose of clamping potential of the SOI substrate 104, device sizes of the ESD enhancement circuit is smaller than the device sizes of the ESD protection circuit. For example, a lateral area size of the clamping diode 121, 122, or 123 of the ESD enhancement circuit may be about 100 times smaller than a lateral area size of the ESD current shunt diodes 311, 312, or 113 of the ESD protection circuit.

Figure 4:
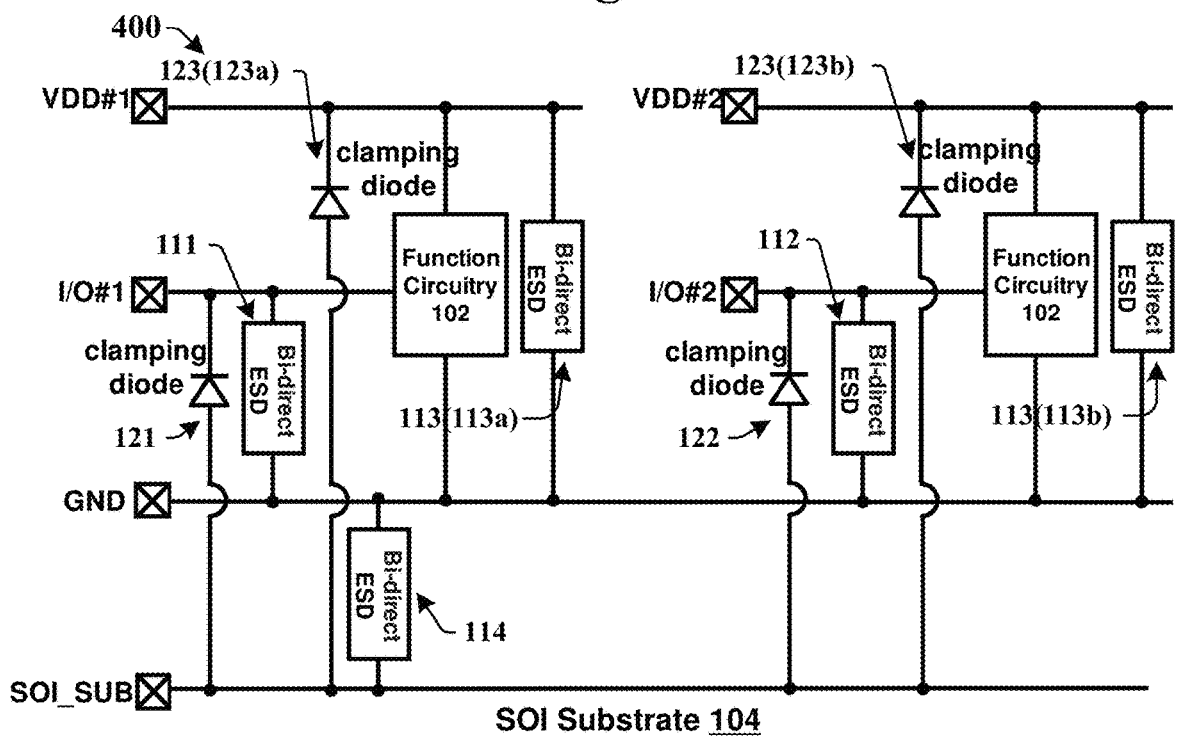
FIG. 4 illustrates a circuit diagram of an integrated circuit including an electrostatic discharge (ESD) enhancement circuit integrated with a silicon on insulator (SOI) device in accordance with some alternative embodiments.

FIG. 4 illustrates a circuit diagram of an integrated circuit (IC) 400 including an ESD enhancement circuit integrated with a silicon on insulator (SOI) device 102 in accordance with some alternative embodiments. The IC 400 may have similar ESD enhancement circuit features as described above associated with FIG. 1 and FIG. 2. The ESD enhancement circuit may comprise pairs of clamping diodes connected back to back between two terminals of the IC 400 and having their anodes directly connected together and connected to the SOI substrate 104. For example, a first clamping diode 121 and a second clamping diode 122 are connected back to back having the cathodes respectively connected to the first I/O terminal I/O #1 and the second I/O terminal I/O #2 and anodes connected together and directly connected to the SOI substrate 104. Also, the first clamping diode 121 and a third clamping diode 123*a* are connected back to back having the cathodes respectively connected to the first I/O terminal I/O #1 and the power supply terminal VDD #1 and anodes connected together and directly connected to the SOI substrate 104. As an alternative embodiment to the IC 200 shown in FIG. 2, the IC 400 may comprise an SOI substrate terminal SOI_SUB coupled to the SOI substrate 104. A bias may be applied between the SOI substrate terminal SOI_SUB and the ground terminal GND. A bi-directional ESD protection device 114 may be connected between the ground terminal GND and the SOI substrate terminal SOI_SUB. As an example, the bi-directional ESD protection device 114 may comprise a pair of back to back Zener or avalanche diodes.

Figure 5:
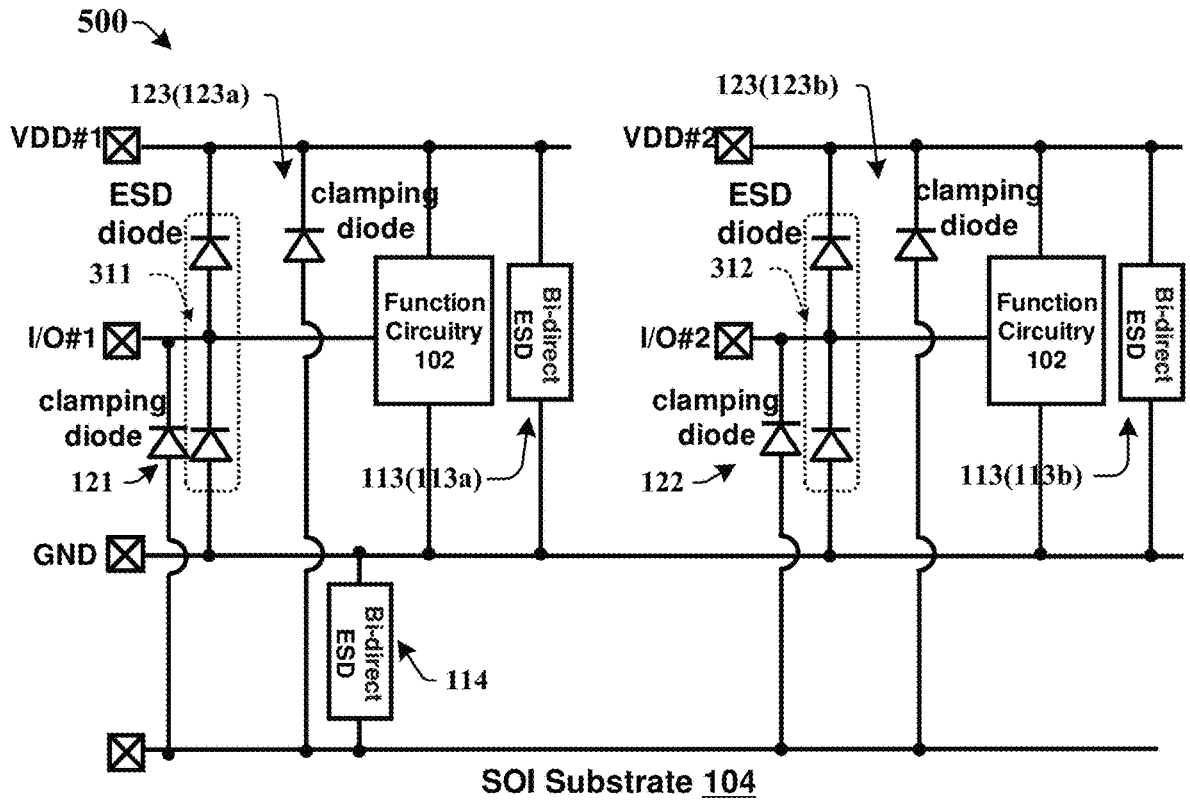
FIG. 5 illustrates a circuit diagram of an integrated circuit including an electrostatic discharge (ESD) enhancement circuit integrated with a silicon on insulator (SOI) device in accordance with some alternative embodiments.

FIG. 5 illustrates a circuit diagram of an integrated circuit (IC) 500 including an ESD enhancement circuit integrated with a silicon on insulator (SOI) device 102 in accordance with some alternative embodiments. The IC 500 may have similar clamping diodes and ESD current shunt diodes features as described above associated with FIG. 3. As an alternative embodiment to the IC 300 shown in FIG. 3, the IC 500 may comprise an SOI substrate terminal SOI_SUB coupled to the SOI substrate 104. A bias may be applied between the SOI substrate terminal SOI_SUB and the ground terminal GND. A bi-directional ESD protection device 114 may be directly connected between the ground terminal GND and the SOI substrate terminal SOI_SUB. As an example, the bi-directional ESD protection device 114 may comprise a pair of back to back Zener or avalanche diodes. A first clamping diode 121 may have a first cathode connected to the first I/O terminal I/O #1 and a first anode directly connected to the SOI substrate 104. A second clamping diode 122 may have a second cathode connected to the second I/O terminal I/O #2 and a second anode directly connected to the SOI substrate 104. A third clamping diode 123 (123*a*, 123*b*) may have a third cathode connected to the power supply terminal (VDD #1, VDD #2) and a third anode directly connected to the SOI substrate 104. A first pair of ESD current shunt diodes 311 comprises a first ESD current shunt diode connected between the first I/O terminal I/O #1 and the power supply terminal VDD #1 and a second ESD current shunt diode connected between the first I/O terminal I/O #1 and the ground terminal GND. A second pair of ESD current shunt diodes 312 comprises a first ESD current shunt diode connected between the second I/O terminal I/O #2 and the power supply terminal VDD #2 and a second ESD current shunt diode connected between the second I/O terminal I/O #2 and the ground terminal GND.

Figure 6:
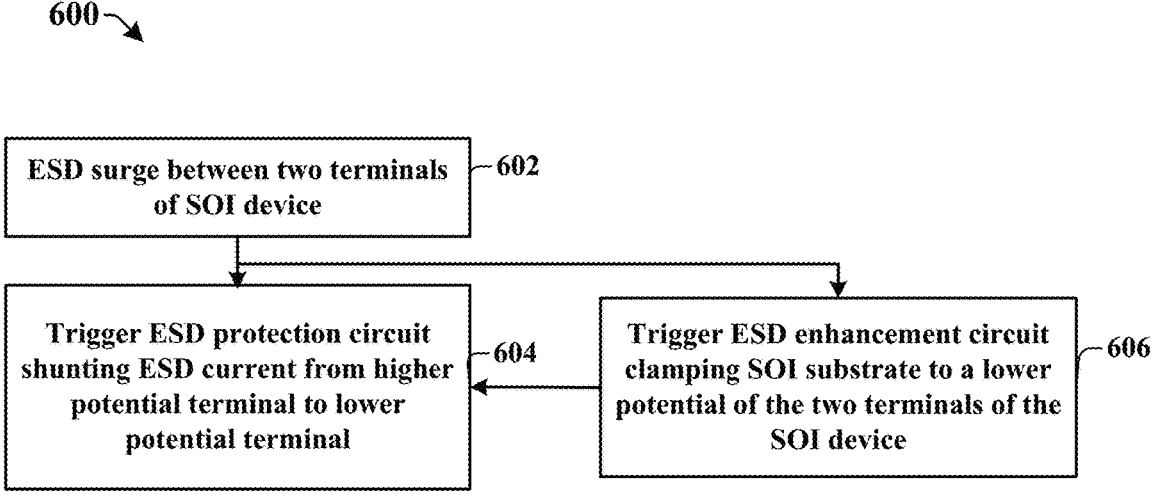
FIG. 6 illustrates a flow diagram illustrating a method of protecting a SOI device during an ESD surge event in accordance with some embodiments.

FIG. 6 illustrates a flow diagram illustrating a method 600 of protecting a SOI device during an ESD surge event in accordance with some embodiments. The method 600 triggers an ESD protection path to shunt ESD current and an ESD enhancement circuit to clamp a SOI substrate to a stable low potential. The SOI device is protected from damaging by shunting the ESD current and introducing a clamping process to the SOI substrate.

The operation cycle starts at block 602, wherein an ESD surge strikes and biases a terminal of a SOI device. In some cases, the ESD surge may strike I/O terminals of the SOI device. In some other cases, the ESD surge may also strike power supply or other terminals of the SOI device. The ESD surge can be either positive bias or negative bias. If the ESD surge is within a maximum strike value allowed, the ESD protection circuit is not triggered. Almost no protection current flows through the ESD protection circuit. If the ESD surge exceeds the maximum strike value allowed, the ESD protection circuit will be triggered. The ESD enhancement circuit will enhance the ESD performance of the SOI device.

At block 604, the ESD protection path is triggered if the ESD surge exceeds the maximum strike value allowed. The ESD current will shunt through the ESD protection path, from a higher potential terminal to a lower potential terminal.

At block 606, the ESD enhancement circuit is triggered when the ESD surge biases between two terminals of the SOI device. The ESD enhancement circuit may include pairs of clamping diodes connected back to back and having cathodes respectively connected to the two terminals of the SOI device and anodes connected together and connected to a SOI substrate. For example, the ESD enhancement circuit may comprise a first clamping diode and a second clamping diode connected back to back having the cathodes respectively connected to a first I/O terminal and a second I/O terminal and anodes connected together and directly connected to the SOI substrate. The ESD enhancement circuit may further comprise a third clamping diode having a third cathode connected to the power supply terminal and a third anode directly connected to the SOI substrate. The ESD enhancement circuit may further comprise a fourth clamping diode having a fourth cathode directly connected to the circuit ground terminal and a fourth anode directly connected to the SOI substrate. Since the ESD enhancement circuit is for purpose of clamping potential of the SOI substrate, device sizes of the ESD enhancement circuit is smaller than the device sizes of the ESD protection path. The ESD enhancement circuit clamps the SOI substrate to a low stable potential. Thereby, a stable high SOI device breakdown voltage and safe operation area (SOA) can be achieved.

It will be appreciated that while reference is made throughout this document to exemplary structures in discussing aspects of methodologies described herein (e.g., the structure presented in FIG. 1, while discussing the example set forth in FIG. 2), that those methodologies are not to be limited by the corresponding structures presented. Rather, the methodologies (and structures) are to be considered independent of one another and able to stand alone and be practiced without regard to any of the particular aspects depicted in the Figures.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular function block, it will be appreciated that alternative separate blocks may be utilized as will be appreciated by one of ordinary skill in the art.

In some embodiments, the present disclosure relates to an integrated circuit. The integrated circuit comprises a silicon on insulator (SOI) device separated from a SOI substrate by an insulation layer. The SOI device comprises a power supply terminal, a ground terminal, a first I/O terminal and a second I/O terminal. An electrostatic discharge (ESD) protection circuit is integrated with the SOI device. The ESD protection circuit is configured to shunt current between two terminals of the SOI device during an ESD surge event. An electrostatic discharge (ESD) enhancement circuit is integrated with the SOI device. The ESD enhancement circuit is configured to clamping the SOI substrate to a lower potential of the two terminals of the SOI device.

In some other embodiments, the present disclosure relates to an integrated circuit. The integrated circuit comprises a silicon on insulator (SOI) device separated from a SOI substrate by an insulation layer. The SOI device comprises a power supply terminal, a ground terminal, a first I/O terminal and a second I/O terminal. An electrostatic discharge (ESD) enhancement circuit is integrated with the SOI device and configured to clamping the SOI substrate to a lower potential of the two terminals of the SOI device. The ESD enhancement circuit comprises a first clamping diode having a first cathode connected to the first I/O terminal and a first anode directly connected to the SOI substrate.

Still in some other embodiments, the present disclosure relates to a method of protecting a SOI device during an ESD surge event between two terminal s of the SOI device. The method comprises triggering an electrostatic discharge (ESD) protection circuit to shunt current between the two terminals of the SOI device during the ESD surge event. The method further comprises triggering an electrostatic discharge (ESD) enhancement circuit to clamping a SOI substrate of the SOI device to a lower potential of the two terminals of the SOI device in response to the ESD surge event.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An integrated circuit, comprising:
    a silicon on insulator (SOI) device separated from a SOI substrate by an insulation layer, the SOI device comprising a power supply terminal, a ground terminal, a first I/O terminal and a second I/O terminal;
    an electrostatic discharge (ESD) protection circuit integrated with the SOI device, the ESD protection circuit configured to shunt current between two terminals of the SOI device during an ESD surge event; and
    an electrostatic discharge (ESD) enhancement circuit integrated with the SOI device, the ESD enhancement circuit configured to clamping the SOI substrate to a lower potential of the two terminals of the SOI device.

2. The integrated circuit of claim 1, wherein the ESD enhancement circuit comprises a pair of clamping diodes having cathodes respectively connected to the two terminals and anodes connected to the SOI substrate.

3. The integrated circuit of claim 2, wherein the anodes of the pair of clamping diodes are connected to the SOI substrate through a conductive via disposed through the insulation layer.

4. The integrated circuit of claim 1, wherein the ESD protection circuit comprises a bi-directional ESD protection device connected between the two terminals.

5. The integrated circuit of claim 4, wherein the bi-directional ESD protection device comprises a pair of back to back Zener or avalanche diodes.

6. The integrated circuit of claim 1, wherein the ESD enhancement circuit comprises:
    a first clamping diode having a first cathode connected to the first I/O terminal and a first anode directly connected to the SOI substrate; and
    a second clamping diode having a second cathode connected to the second I/O terminal and a second anode directly connected to the SOI substrate.

7. The integrated circuit of claim 6, wherein the ESD enhancement circuit further comprises:
    a third clamping diode having a third cathode connected to the power supply terminal and a third anode directly connected to the SOI substrate.

8. The integrated circuit of claim 7, wherein the ESD enhancement circuit further comprises:
    a fourth clamping diode having a fourth cathode connected to the ground terminal and a fourth anode directly connected to the SOI substrate.

9. The integrated circuit of claim 8, wherein the ESD protection circuit comprises
    a first bi-directional ESD protection device connected between the first I/O terminal and the ground terminal; and
    a second bi-directional ESD protection device connected between the second I/O terminal and the ground terminal.

10. The integrated circuit of claim 9, wherein the ESD protection circuit further comprises
    a third bi-directional ESD protection device connected between the power supply terminal and the ground terminal.

11. The integrated circuit of claim 10, wherein the ESD protection circuit further comprises
    a fourth bi-directional ESD protection device connected between the ground terminal and the SOI substrate.

12. The integrated circuit of claim 8, wherein the ESD protection circuit comprises:

a bi-directional ESD protection device connected directly between the power supply terminal and the ground terminal.

13. The integrated circuit of claim 1, wherein the ESD protection circuit and the ESD enhancement circuit are arranged in parallel from one another between the two terminals.

14. An integrated circuit, comprising:
a silicon on insulator (SOI) device separated from a SOI substrate by an insulation layer, the SOI device comprising a power supply terminal, a ground terminal, a first I/O terminal, and a second I/O terminal; and
an electrostatic discharge (ESD) enhancement circuit integrated with the SOI device and configured to clamping the SOI substrate to a lower potential of two terminals of the SOI device;
wherein the ESD enhancement circuit comprises a first clamping diode having a first cathode connected to the first I/O terminal and a first anode directly connected to the SOI substrate.

15. The integrated circuit of claim 14, further comprising:
an electrostatic discharge (ESD) protection circuit integrated with the SOI device and configured to shunt current between the two terminals of the SOI device during an ESD surge event.

16. The integrated circuit of claim 15, wherein the ESD protection circuit comprises:
a bi-directional ESD protection device connected directly between the power supply terminal and the ground terminal.

17. The integrated circuit of claim 14, wherein the ESD enhancement circuit further comprises a second clamping diode having a second cathode connected to the second I/O terminal and a second anode directly connected to the SOI substrate.

18. An integrated circuit, comprising:
a silicon on insulator (SOI) device separated from a SOI substrate by an insulation layer, the SOI device comprising a power supply terminal, a ground terminal, a first I/O terminal and a second I/O terminal; and
an electrostatic discharge (ESD) enhancement circuit integrated with the SOI device and configured to clamping the SOI substrate to a lower potential of the two terminals of the SOI device, the ESD enhancement circuit comprising a first clamping diode and a second clamping diode connected back to back between the first I/O terminal and the second I/O terminal, wherein the first clamping diode and the second clamping diode respectively has a first anode and a second anode directly connected to the SOI substrate; and
an electrostatic discharge (ESD) protection circuit integrated with the SOI device and configured to shunt current between the two terminals of the SOI device during an ESD surge event.

19. The integrated circuit of claim 18, further comprising a third clamping diode directly connected between the power supply terminal and the SOI substrate.

20. The integrated circuit of claim 18, further comprising a fourth clamping diode directly connected between the ground terminal and the SOI substrate.

* * * * *